United States Patent
Naeve

(10) Patent No.: US 11,756,859 B2
(45) Date of Patent: Sep. 12, 2023

(54) PACKAGE WITH CLIP AND CONNECTOR ABOVE ELECTRONIC COMPONENTS

(71) Applicant: Infineon Technologies AG, Neubiberg (DE)

(72) Inventor: Tomasz Naeve, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 65 days.

(21) Appl. No.: 17/216,854

(22) Filed: Mar. 30, 2021

(65) Prior Publication Data

US 2021/0305126 A1 Sep. 30, 2021

(30) Foreign Application Priority Data

Mar. 31, 2020 (DE) ................. 10 2020 108 916.3

(51) Int. Cl.
*H01L 23/40* (2006.01)
*H01L 23/367* (2006.01)

(52) U.S. Cl.
CPC ...... *H01L 23/4093* (2013.01); *H01L 23/3672* (2013.01)

(58) Field of Classification Search
CPC . H01L 23/31; H01L 23/3672; H01L 23/4093; H01L 23/48; H01L 25/072; H01L 25/18; H01L 25/50
See application file for complete search history.

(56) References Cited

U.S. PATENT DOCUMENTS

| 6,054,759 | A | * | 4/2000 | Nakamura | ............ H01L 25/105 257/691 |
|---|---|---|---|---|---|
| 6,212,087 | B1 | | 4/2001 | Grant et al. | |
| 6,492,202 | B1 | * | 12/2002 | Lober | ................. H01L 23/4093 438/122 |
| 7,271,470 | B1 | | 9/2007 | Otremba | |
| 8,319,333 | B2 | | 11/2012 | Oka et al. | |
| 10,062,671 | B2 | | 8/2018 | Gruber et al. | |
| 2003/0011986 | A1 | * | 1/2003 | Ariga | ...................... G06F 1/203 361/679.17 |
| 2004/0232545 | A1 | * | 11/2004 | Takaishi | ............ H01L 23/49537 257/E23.092 |
| 2008/0023807 | A1 | * | 1/2008 | Noquil | ................ H01L 23/3107 257/E23.101 |
| 2013/0003305 | A1 | | 1/2013 | Stella | |
| 2013/0003309 | A1 | | 1/2013 | Stella | |
| 2013/0320548 | A1 | * | 12/2013 | Carpenter | ........... H01L 23/3135 257/772 |
| 2014/0110788 | A1 | | 4/2014 | Cho et al. | |

(Continued)

FOREIGN PATENT DOCUMENTS

DE 19902462 A1 * 8/2000 ......... H01L 25/0657
DE 10 2009 055 648 7/2010

(Continued)

*Primary Examiner* — Bryan R Junge
(74) *Attorney, Agent, or Firm* — Dicke, Billig & Czaja, PLLC

(57) ABSTRACT

A package which comprises a carrier, electronic components mounted on the carrier, an encapsulant at least partially encapsulating the carrier and the electronic components, a clip connected to upper main surfaces of the electronic components, and an electrically conductive bulk connector which is electrically connected with and mounted above the electronic components.

20 Claims, 5 Drawing Sheets

(56) References Cited

U.S. PATENT DOCUMENTS

| | | | |
|---|---|---|---|
| 2016/0104654 A1* | 4/2016 | Ushijima | ............ H01L 23/4006 257/718 |
| 2018/0308827 A1 | 10/2018 | Wissen et al. | |
| 2019/0164873 A1 | 5/2019 | Chiang et al. | |
| 2021/0057313 A1* | 2/2021 | Choi | .................... H05K 1/0203 |

FOREIGN PATENT DOCUMENTS

| | | |
|---|---|---|
| DE | 10 2015 106 151 | 10/2016 |
| DE | 10 2017 207 565 | 11/2018 |
| JP | 2014-187245 | 10/2014 |

\* cited by examiner

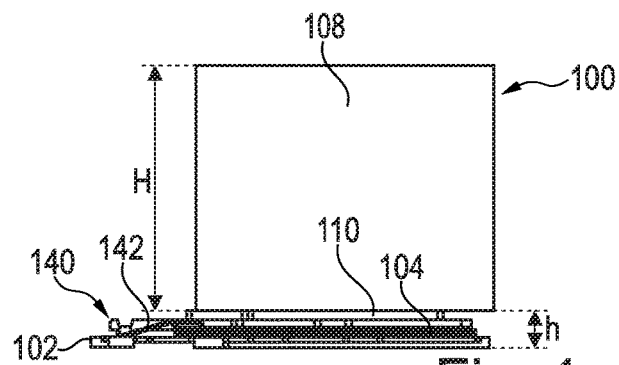
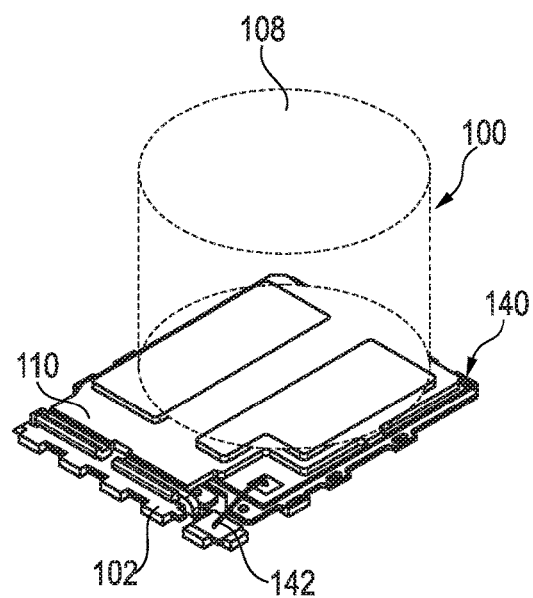
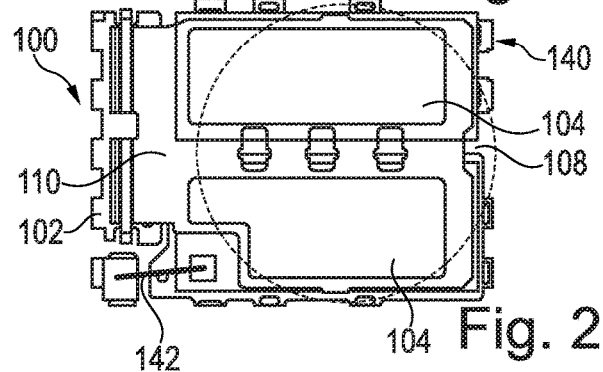
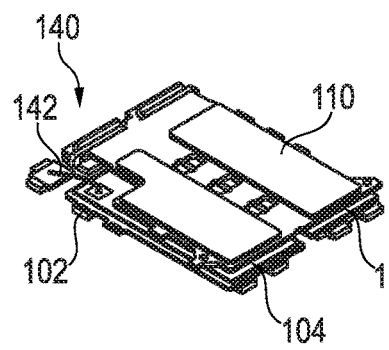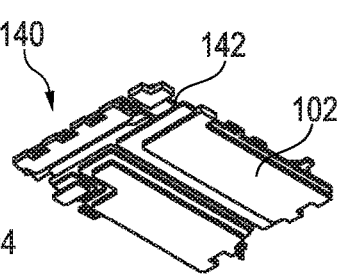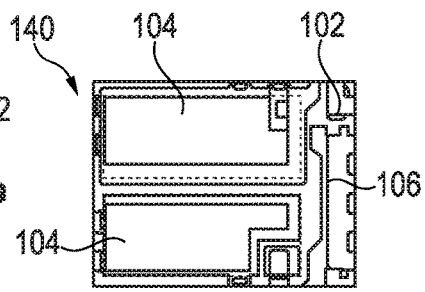
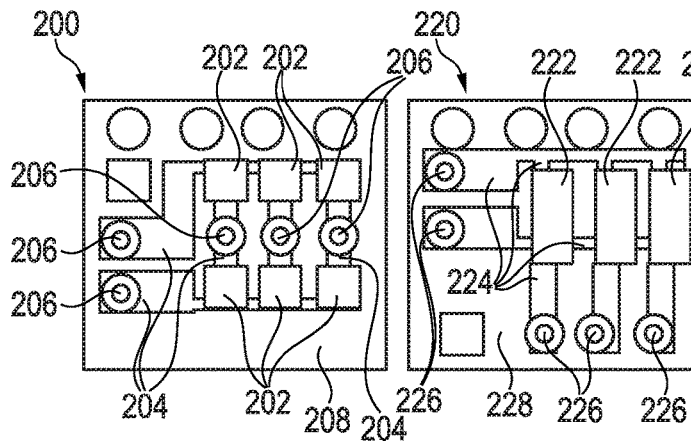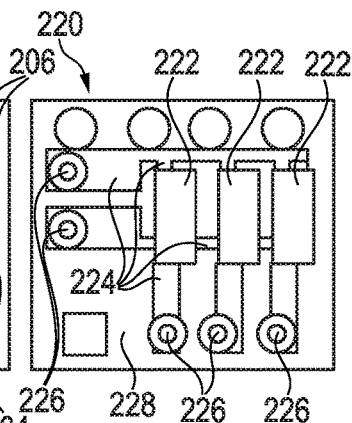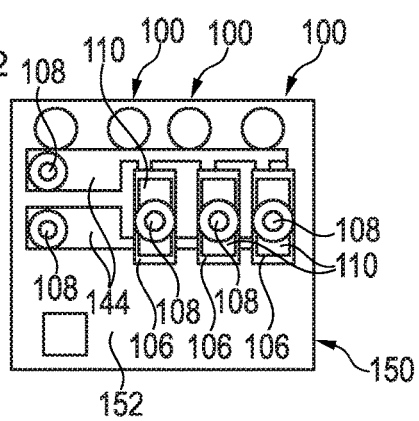

PACKAGE WITH CLIP AND CONNECTOR ABOVE ELECTRONIC COMPONENTS

CROSS-REFERENCE TO RELATED APPLICATION

This Utility Patent application claims priority to German Patent Application No. 10 2020 108 916.3, filed Mar. 31, 2020, which is incorporated herein by reference.

BACKGROUND

Technical Field

Various embodiments relate generally to a package, an electronic device, and a method of manufacturing electronic components.

Description of the Related Art

Packages may be denoted as encapsulated electronic components with electrical connections extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application. In particular, overheating packages during operation may reduce reliability and performance of the package.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a side view of a package according to an exemplary embodiment.

FIG. 2 illustrates a top view of the package of FIG. 1.

FIG. 3 illustrates a three-dimensional view of the package of FIG. 1 and FIG. 2.

FIG. 4 to FIG. 6 illustrate preforms of a package being presently manufactured according to an exemplary embodiment.

FIG. 7A and FIG. 7B illustrates conventional electronic devices.

FIG. 7C illustrates an electronic device according to an exemplary embodiment.

DETAILED DESCRIPTION

Figure 8:
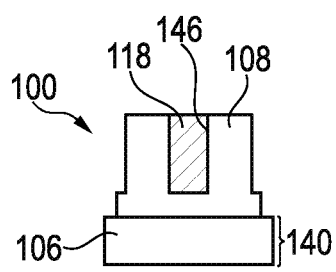
FIG. 8 illustrates a side view of a package according to an exemplary embodiment.

There may be a need to provide a package with high performance and reliability.

According to an exemplary embodiment, a package is provided which comprises a carrier, electronic components mounted on the carrier, an encapsulant at least partially encapsulating the carrier and the electronic components, a clip connected to upper main surfaces of the electronic components, and an electrically conductive bulk connector which is electrically connected with and mounted on top of or above the electronic components.

According to another exemplary embodiment, an electronic device is provided, wherein the electronic device comprises a mounting base, for example a printed circuit board, and a package having the above-mentioned features and being mounted on the mounting base.

According to still another exemplary embodiment, a method of manufacturing a package is provided, wherein the method comprises mounting electronic components on a carrier, at least partially encapsulating the carrier and the electronic components by an encapsulant, connecting a clip to upper main surfaces of the electronic components, and mounting an electrically conductive bulk connector, which electrically connects the electronic components, on top of or above the electronic components.

According to an exemplary embodiment, a package with electronic components on a carrier and a clip on top of the electronic components is provided. This arrangement may be encapsulated partially by an encapsulant. A bulk connector may be connected vertically above the electronic components and in particular on top of the clip for electrically connecting the electronic components in a compact way with a short and substantially straight vertical electric path guiding towards the low ohmic bulk connector. This may significantly reduce the ohmic losses and may reliably avoid overheating during operation. As a result, a package with high electric and thermal reliability as well as high performance may be obtained, even in high current power applications.

In the following, further exemplary embodiments of the package, the electronic device, and the method will be explained.

In the context of the present application, the term "package" may particularly denote a device which may comprise electronic components mounted on a carrier, said carrier to comprise or consist out of a single part, multiple parts joined via encapsulation or other package components, or a subassembly of carriers. Said constituents of the package may be encapsulated at least partially by an encapsulant. It is also possible that one or more electrically conductive interconnect bodies (such as bond wires and/or clips) may be implemented in a package, for instance for electrically coupling the electronic components with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), a light emitting, semiconductor-based device (such as a light emitting diode (LED) or LASER), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "carrier" may particularly denote a support structure (which may be at least partially electrically conductive) which serves as a mechanical support for the electronic components to be mounted thereon, and which may also contribute to the electric interconnection between the electronic components and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad.

In the context of the present application, the term "encapsulant" may particularly denote a substantially electrically insulating material surrounding at least part of an electronic component and at least part of a carrier to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity.

In the context of the present application, the term "clip" may particularly denote an electrically conductive plate structure for connection to electronic components, and optionally also to a carrier. More specifically, a clip may be a three-dimensionally bent plate type connection element which has two planar sections to be connected to an upper main surface of the respective electronic component and an upper main surface of the carrier, wherein the two mentioned planar sections may be interconnected by a slanted or stepped connection section.

In the context of the present application, the term "bulk connector" may particularly denote a solid (and preferably massive) electrically conductive block for electrically and mechanically connecting a package with an electronic environment. In particular, the bulk connector may be a three-dimensional body having a volume larger than, in particular at least three times of, a volume of the rest of the package (i.e. a package body comprising carrier, electronic components, encapsulant and clip). Such a bulk connector may be configured for high current applications, as those which may occur in power semiconductor technology. In particular, a bulk connector may consist only of electrically conductive, in particular metallic, material.

In an embodiment, the electronic components are semiconductor dies, in particular identical semiconductor dies. Both electronic components may be transistor chips.

In an embodiment, each of the semiconductor dies comprises an integrated transistor, in particular a field effect transistor. More specifically, each semiconductor die may comprise a metal oxide semiconductor field effect transistor (MOSFET).

In an embodiment, the electronic components are configured and connected to provide a half-bridge function. In the context of the present application, the term "half-bridge" may particularly denote a circuit composed of an upper transistor switch ("high-side") and a lower transistor switch ("low-side"). For instance, the transistors may be MOSFETs, i.e. metal oxide semiconductor field effect transistors. The transistors may be connected in a cascode arrangement. The two transistor switches may be turned on and off complementary to each other (in particular with a non-overlapping dead-time) by applying corresponding voltage waveforms at each of the control terminals. A desired result may be a square-wave voltage at a mid-point that switches between a first electric potential (such as a DC bus voltage) and a second electric potential (such as ground). The two transistors may be interconnected with a mutual connection of their connection terminals so that a two transistor based switch with implemented diode characteristic may be obtained. The mentioned half-bridge configuration may be used as such or alone, or may be combined with one or more further half-bridges (or other electric circuits) to realize a more complex electric function. For instance, two such half-bridges may form a full bridge. Also inverters may be composed on the basis of half-bridges.

In an embodiment, the electrically conductive bulk connector is arranged outside of the encapsulant, in particular is arranged entirely outside of the encapsulant. The clip to which the bulk connector may be connected may have a surface portion being exposed with respect to the encapsulant. The bulk connector may be connected to said exposed clip surface. In particular, the entire surface of the bulk connector may be free of encapsulant material, i.e. may be completely exposed with respect to the encapsulant. This may allow connecting, for instance soldering, the bulk connector to the rest of the package after encapsulation.

In an embodiment, the connector is mounted, in particular soldered, on an upper surface of the clip so that the electronic components are vertically spaced with respect to the connector by the clip. In other words, the clip may be sandwiched between the electronic chips and the bulk connector. This may establish a substantially vertical current flow allowing for a low ohmic configuration of the package.

In an embodiment, the encapsulant only partially encapsulates the clip so that an exposed surface of the clip is provided which may be in direct connection with the bulk connector. Hence, the clip may be partially encapsulated and partially exposed. The bulk connector may be directly connected, in particular soldered, on the exposed clip portion, which can be done with low requirements in terms of positional accuracy.

In an embodiment, the clip is connected as well to an upper main surface of the carrier. By taking this matter, an electric coupling between a top side of the electronic components, the bulk connector and the carrier may be established.

In an embodiment, the connector has a height which is larger than, in particular is at least three times or at least five times of, a height of a package body composed of the carrier, the electronic components, the encapsulant and the clip. Correspondingly, the connector may have a volume which is larger than, in particular is at least three times or at least five times of, a volume of a package body composed of the carrier, the electronic components, the encapsulant and the clip. In other words, the bulk connector may dominate the package in terms of height, volume and/or mass.

In an embodiment, the connector is a metal block, in particular a cylindrical metal block. Also other geometries are possible, see for instance FIG. 20.

In an embodiment, the connector comprises a cooling structure, in particular a plurality of cooling fins, more particularly a plurality of cooling fins extending radially from a central main body of the connector or extending in parallel to each other. Hence, the bulk connector may synergistically function for providing a low ohmic electric connection for preventing hot spots and may simultaneously promote heat removal by a cooling structure which may be integrally formed with the bulk connector. For instance, a plurality of cooling fins may extend as pillars or blades from an electrically conductive main body of the connector. For instance, such cooling fins may extend radially outwardly from the central main body for obtaining a particularly pronounced heat removal. Also a parallel arrangement of cooling blades may be advantageous, for instance when multiple packages are assembled below the same bulk connector.

In an embodiment, the connector comprises a mounting provision configured for mounting the connector on a mounting base. In particular, such a mounting provision may be configured for establishing a screwing connection with a mounting base. In such a configuration, the bulk connector may comprise an integrally formed sub-structure (for instance one or more metallic legs) for establishing a mechanical connection between the bulk connector (and thus the package as a whole) and a mounting base (such as a printed circuit board). A separate part for mounting the package on the mounting base may then be dispensable.

In an embodiment, the connector has a central recess with an internal thread. Hence, a screw shaft with an exterior thread may be used for establishing a screw connection between the connector and another electric apparatus comprising said screw shaft.

In an embodiment, the electronic device comprises at least one further package mounted on the mounting base. In particular, the electronic device may comprise two further packages (i.e. altogether three packages) mounted on the mounting base. Each of the at least one further package may comprise two electronic components mounted on a further carrier and at least partially encapsulated by a further encapsulant. The connector may be electrically connected with and mounted on top of or above the electronic components of the package and of the at least one further package (preferably two further packages). Advantageously, a single bulk connector may support a low ohmic connection of multiple packages.

In an embodiment, the connector comprises a cooling structure configured for cooling all packages assembled to said connector. In particular, such a connector may comprise cooling fins, preferably an array of parallel cooling fins. In such a configuration, the cooling fins may be multiple spaced blades with a high heat removal surface for efficiently cooling the packages of the electronic device.

In another embodiment, the electronic device comprises at least one further package having the above-mentioned features and mounted on the mounting base. In particular, two further packages having the above-mentioned features may be provided (i.e. altogether three packages of this type) and mounted on the mounting base. Thus, three packages according to one of the above described embodiments may be interconnected in a low ohmic configuration.

In an embodiment, the electronic components are located vertically between the mounting base and the connector. In other words, the mounting base and the bulk connector may be arranged on two opposing sides of the electronic components. The electronic components of an electronic device may be arranged at the same vertical level, i.e. in a coplanar way.

In an embodiment, the carrier comprises a leadframe or a thermally conductive and electrically insulating sheet covered on both opposing main surfaces with an electrically conductive layer. For instance, such a carrier may be a leadframe-type structure (for instance made of copper). In another embodiment, the carrier (rather than being embodied as metallic plate sections of a leadframe, as described above) comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may be embodied as a Direct Copper Bonding (DCB) substrate or a Direct Aluminium Bonding (DAB) substrate.

In an embodiment, the electronic component is configured as a power semiconductor chip. Thus, the electronic component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, a respective electronic component experiences a vertical current flow. The package architecture according to exemplary embodiments is particularly appropriate for high power applications in which a vertical current flow is desired, i.e. a current flow in a direction perpendicular to the two opposing main surfaces of the electronic component, one of which being used for mounting the electronic component on the carrier.

As substrate or wafer forming the basis of the electronic components, a semiconductor substrate, preferably a silicon substrate, may be used. Alternatively, a silicon oxide or another insulator substrate may be provided. It is also possible to implement a germanium substrate or a III-V- semiconductor material. For instance, exemplary embodiments may be implemented in gallium nitride or silicon carbide technology.

For the encapsulating, a plastic-like material or a ceramic material which may be subsidized by encapsulant additives such as filler particles, additional resins or others may be used.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

An exemplary embodiment provides a package configured as surface mounted device (SMD)-type half-bridge. Advantageously, encapsulated electronic components of the package mounted on a carrier may be provided with a top side bulk connector for connecting the package with an electronic environment such as a printed circuit board (PCB). In particular, an exemplary embodiment provides an SMD-integrated half-bridge with mechanical top side bulk connector. This may shorten current paths and may promote a low ohmic current flow so as to advantageously prevent excessive overheating of the package and in particular of critical portions thereof. In particular, an electric bulk connector can be soldered on top of a portion of the clip being exposed with respect to the encapsulant. A bottom side of the clip may be connected to electronic components of the package.

In embodiments, the electric bulk connector, which can be soldered on top of the exposed clip, can be provided with additional metal fins to further improve the top side cooling.

Furthermore, it may be possible that the electric bulk connector can also be screwed down on a mounting base.

Moreover, embodiments accomplish a top side connection of multiple (in particular three) parallel packages or devices.

Advantageously, exemplary embodiments may improve the performance of the package and the power density on a mounting base or application board (for instance for a package embodied as a 6×8 scalable PowerBlock).

Conventionally, users of power tools may use discrete power MOSFET (metal oxide semiconductor field effect transistor) components to build-up a three-phase inverter to provide electrical energy to a motor. Five massive metal connectors may be used. Two may be used to provide the battery voltage to the power board and the three other connectors may provide the three phases of the inverter to the electrical motor of the power tool.

Due to increasing power density effort, it may be advantageous to combine high side MOSFETs and low side MOSFETs of each half-bridge into one package in order to gain power density and have the opportunity to reduce the board space.

When a clip is exposed towards the package top side, due to the reduced footprint with the scalable half-bridge the thermal management of such a package may be challenging.

According to an exemplary embodiment, an SMD-power package may be provided which is based on a scalable half-bridge with exposed clip, wherein a mechanical power connector or bulk connector is placed on top of the clip. In particular, said bulk connector may be soldered on the top side of the exposed clip.

Such a package according to an exemplary embodiment may offer several benefits compared to conventional approaches: Firstly, exemplary embodiments may result in a package resistance reduction. Moreover, a reduced peak current density and a lower electromigration risk may be obtained, which may allow higher maximum current. Apart from this, exemplary embodiments may achieve an improved thermal performance. Furthermore, a reduced board space may be sufficient, and a lower board resistance may be obtained. In order to further improve the heat removal capability, the bulk connector may be provided optionally with metal fins soldered on package top. Furthermore, it is possible that the bulk connector is screwed on package top side. In particular, it may be possible to connect three half-bridges parallel with a screwed top side bulk connector.

With a package according to exemplary embodiments, a pure vertical current flow may be realized and therefore no current redistribution within the package may be required. This may significantly reduce the package resistance. Furthermore, the top side bulk connector may improve the thermal performance. An embodiment may also be realized using different kind of package platforms where a half-bridge can be included like various chip embedding package platforms.

For soldering the bulk connector on top of the package, many different kinds of PCB (printed circuit board) connectors may be used.

FIG. 1 illustrates a side view of a package 100 according to an exemplary embodiment. FIG. 2 illustrates a top view of the package 100 of FIG. 1. FIG. 3 illustrates a three-dimensional view of the package 100 of FIG. 1 and FIG. 2. FIG. 4, FIG. 5 and FIG. 6 illustrate preforms of package 100 being presently manufactured according to an exemplary embodiment, i.e. preforms being not yet provided with a bulk connector 108.

The illustrated package 100 comprises a leadframe-type carrier 102. In other words, carrier 102 is a structured copper plate.

Two thin electronic components 104 are mounted on the carrier 102 by soldering. Each electronic component 104 is embodied as a semiconductor power chip having a monolithically integrated field effect transistor. More specifically, the electronic components 104 may be MOSFET chips, one being arranged in a top sided way and the other being arranged in a bottom sided way. The electronic components 104 configured as field effect transistor chips may have a drain pad on one main surface and a source pad and a gate pad on the other main surface. For instance, one of the electronic components 104 may be arranged with the drain pad at a top side, and the other electronic component 104 may be arranged with the drain pad at a bottom side. The current may flow vertical through the respective electronic component 104. The two electronic components 104 may be interconnected so as to form a half-bridge. The electronic components 104 are embodied as two identical semiconductor dies.

Furthermore, the package 100 comprises a clip 110 connected (for instance by soldering) to upper main surfaces of the electronic components 104. Clip 110 may be a plate-shaped (and for instance three-dimensional bent) metallic member configured for contacting pads of the electronic components 104 at their upper main surfaces and configured for contacting the metallic surface of the upper side of the carrier 102.

An encapsulant 106, which is here embodied as a mold compound, partially encapsulates the carrier 102 and the electronic components 104. Moreover, the encapsulant 106 partially encapsulates the clip 110 in such a way that an upper main surface of the clip 110 remains exposed with respect to the encapsulant 106. For illustrative purposes, the encapsulant 106 is only shown in FIG. 6.

Moreover, an electrically conductive bulk connector 108 is provided, which may be arranged completely outside of the encapsulant 106. Notwithstanding said encapsulation, the electrically conductive bulk connector 108 may remain arranged entirely outside of the encapsulant 106. The bulk connector 108 may be soldered on the exposed upper metallic surface of the clip 110 and is thereby electrically connected with and located above the electronic components 104. Hence, the bulk connector 108 is soldered on an upper surface of the clip 110 so that the electronic components 104 are spaced with respect to the connector 108 by the clip 110. Advantageously, the encapsulant 106 only partially encapsulates the clip 110 so that an exposed surface of the clip 110 can be brought in electric and mechanical contact with the connector 108. Apart from connecting the electronic components 104 and the bulk connector 108, the clip 110 is also connected to an upper main surface of the carrier 102. As a consequence, the electric path of a current flowing vertical through the electronic components 104 may be substantially vertical along the entire path from the carrier 102, through the electronic components 104, the clip 110 and to the bulk connector 106. This short and substantially vertical electric path keeps ohmic losses small and prevents highly undesired hot spots in the package 100.

As shown in FIG. 1, the connector 108 has a height H which is significantly larger than a height h of a package body 140 composed of the carrier 102, the electronic components 104, the encapsulant 106, and the clip 110. As shown, the bulk connector 108 may be embodied as a massive cylindrical metal block.

Furthermore, one or more bond structures 142 (such as bond wires or bond ribbon) may be provided for interconnecting portions of the carrier 102 with the clip 110.

Concluding, in the embodiment of FIG. 1 to FIG. 6, the thermally properly conductive massive metal block in form of the bulk connector 108 may be soldered directly on top of the exposed clip 110 and directly above the electronic components 104 to thereby establish a substantially vertical current flow. A complex and high ohmic planar redistribution structure may thus be advantageously avoided fully or to a large extent. The package 100 shown in FIG. 1 to FIG. 6 can then be soldered on a mounting base such as a printed circuit board (compare for instance reference sign 152 in FIG. 13). For instance, the package 100 according to FIG. 1 to FIG. 6 may be connected to an electric motor (not shown) in a low ohmic way and without the danger of hot spots.

FIG. 7A and FIG. 7B illustrates conventional electronic devices 200, 220.

Electronic device 200 has six packages 202 (each with an encapsulated semiconductor chip, not shown) interconnected via an electrically conductive redistribution structure 204. Connectors 206 are arranged side-by-side to the packages 202 and extend vertical with respect to the paper plane of FIG. 7A. The mentioned constituents may be mounted on a mounting base 208.

Electronic device 220 has three packages 222 (each with two encapsulated semiconductor chips, not shown) interconnected via an electrically conductive redistribution structure 224. Connectors 226 are arranged side-by-side to the packages 222 and extend vertical with respect to the paper plane of FIG. 7B. The mentioned constituents may be mounted on a mounting base 228.

Due to the long horizontal traces, in particular in form of the redistribution structures 204, 224 connecting the packages 202, 222 with the conductors 206, 226, the embodiments of FIG. 7A and FIG. 7B may suffer from excessive hot spots and high ohmic losses.

FIG. 7C illustrates an electronic device 150 according to an exemplary embodiment.

Electronic device 150 has three packages 100 (each with two encapsulated semiconductor chips, not shown) connected via exposed clips 110 on the upper side directly vertically with a respective bulk connector 108 arranged vertically stacked on the packages 100 and extending vertical with respect to the paper plane of FIG. 7C. The mentioned constituents may be mounted on a mounting base 152 such as a printed circuit board (PCB). A smaller amount of horizontal traces 144 is sufficient according to FIG. 7C, compared with the more complex redistribution structures 204, 224 according to FIG. 7A and FIG. 7B.

Due to the vertical connection of the electronic components 104 (not shown in FIG. 7C) and the clip 110 on top thereof with the also vertically extending bulk connectors 108, the embodiment of FIG. 7C advantageously avoids hot spots and can be operated with low ohmic losses.

Figure 9:
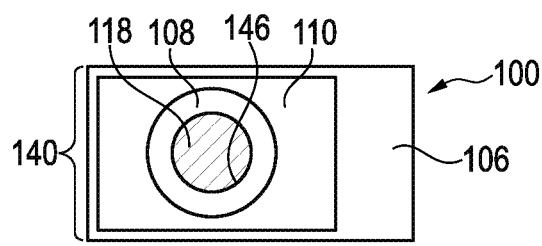
FIG. 9 illustrates a top view of the package of FIG. 8.

FIG. 8 illustrates a side view of a package 100 according to an exemplary embodiment. FIG. 9 illustrates a top view of the package 100 of FIG. 8.

In the embodiment of FIG. 8 and FIG. 9, the connector 108 has a central recess 118 with an internal thread 146. This allows to establish a screw connection between the connector 108 and another electronic arrangement with a connection pin having an external thread (not shown) corresponding to the recess 118 and the internal thread 146.

Figure 10:
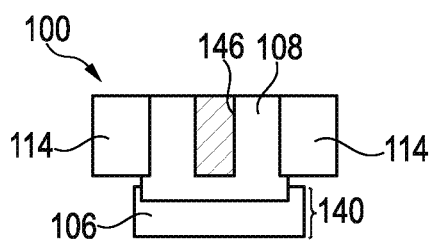
FIG. 10 illustrates a side view of a package according to an exemplary embodiment.
Figure 11:
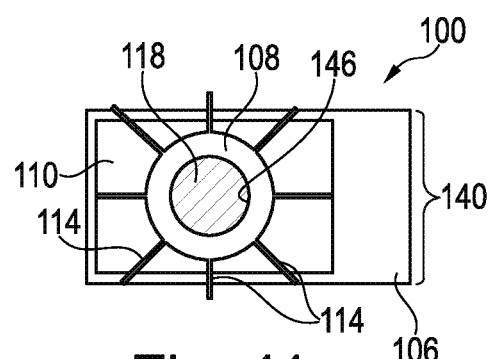
FIG. 11 illustrates a top view of the package of FIG. 10.

FIG. 10 illustrates a side view of a package 100 according to an exemplary embodiment. FIG. 11 illustrates a top view of the package 100 of FIG. 10.

In the embodiment of FIG. 10 and FIG. 11, the connector 108 comprises a cooling structure 114 embodied as a plurality of metallic cooling fins being integrally formed with and extending radially from a central main body of the connector 108. The blade-shaped cooling fins extending radially outwardly promote a proper heat removal from the connector 108 during operation of the package 100.

Figure 12:
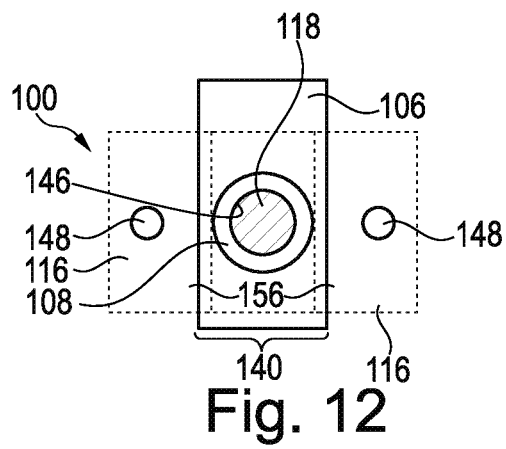
FIG. 12 illustrates a top view of a package according to an exemplary embodiment.
Figure 13:
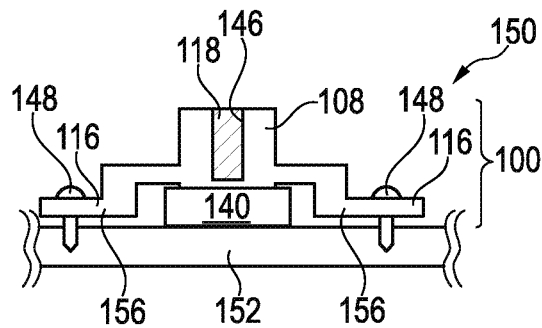
FIG. 13 illustrates a side view of the package of FIG. 12 mounted on a mounting base for obtaining an electronic device according to an exemplary embodiment.

FIG. 12 illustrates a top view of a package 100 according to an exemplary embodiment. FIG. 13 illustrates a side view of the package 100 of FIG. 12 mounted on a mounting base 152 for obtaining an electronic device 150 according to an exemplary embodiment.

In the embodiment of FIG. 12 and FIG. 13, the connector 108 comprises a mounting provision 116 configured for mounting the connector 108 on a mounting base 152. The electronic components 104 may be located vertically between the mounting base 152 and the connector 108.

More specifically, the mounting provision 116 is configured for establishing a screwing connection with mounting base 152. By mounting the package 100 on the mounting base 152, an electronic device 150 according to an exemplary embodiment is obtained. Said mounting base 152 may be embodied as a printed circuit board (PCB). For establishing the screw connection between the mounting base 152 and the package 100, one or more screws 148 may be guided through screw holes formed as part of the mounting provision 114 in one or more metallic legs 156 of the mounting provision 114 being integrally formed with the bulk connector 108 and extending in a lateral direction. Said one or more screws 148 may then be connected with the mounting base 152. As shown in FIG. 12 and FIG. 13, two metallic legs 156 extend laterally and downwardly from opposing sides of the central main body of the bulk connector 108. For instance, a bottom side of said metallic legs 156 may be aligned or substantially aligned with a bottom side of the package body 140. As illustrated as well and for the sake of bridging a vertical distance, the metallic legs 156 extend downwardly in a stepped configuration. The shown embodiment provides a large contact area between mounting base 152 and package 100 and therefore provides a high degree of positional accuracy.

Although not shown in FIG. 13, the electronic device 150 may comprise for instance two further packages 100, wherein each of the two further packages 100 may be embodied as the illustrated and described package 100 and may be arranged side-by-side to said package 100. All three packages 100 may thus be mounted side-by-side and coplanar on the same mounting base 152 (not shown). The three packages 100 may be interconnected to form a three-phase inverter.

Figure 14:
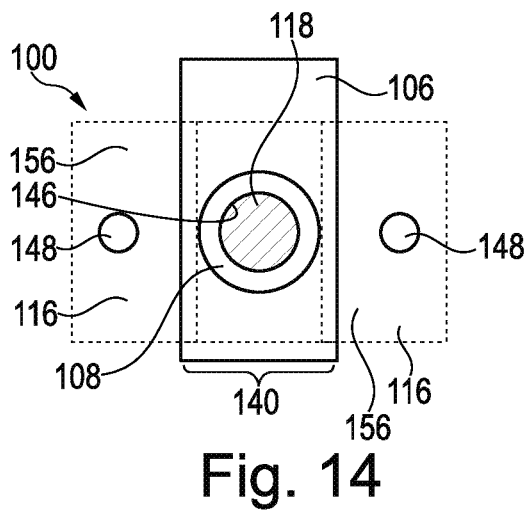
FIG. 14 illustrates a top view of a package according to an exemplary embodiment.
Figure 15:
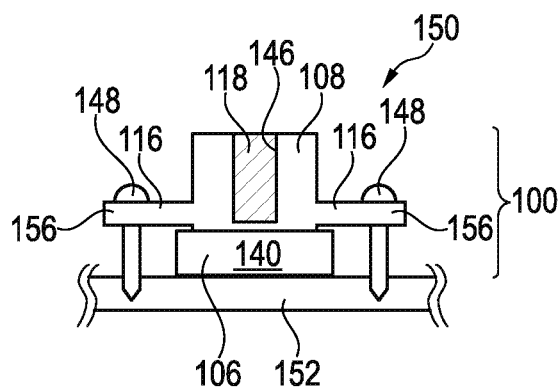
FIG. 15 illustrates a side view of the package of FIG. 14 mounted on a mounting base for obtaining an electronic device according to an exemplary embodiment.

FIG. 14 illustrates a top view of a package 100 according to an exemplary embodiment. FIG. 15 illustrates a side view of the package 100 of FIG. 14 mounted on a mounting base 152 for obtaining an electronic device 150 according to an exemplary embodiment.

The embodiment of FIG. 14 and FIG. 15 differs from the embodiment of FIG. 12 and FIG. 13 in particular in that, according to FIG. 14 and FIG. 15, the metallic legs 156 extend from the central main body of the connector 108 in a purely horizontal direction. This simplifies the construction.

Figure 16:
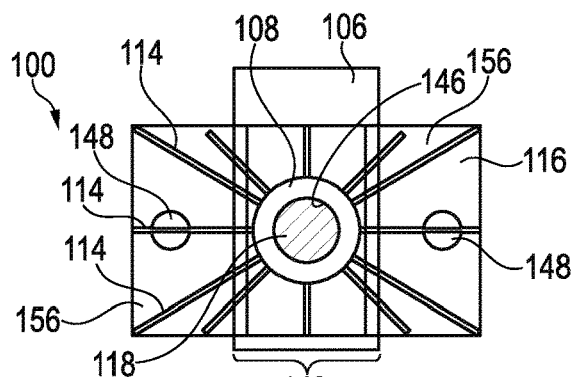
FIG. 16 illustrates a top view of a package according to an exemplary embodiment.
Figure 17:
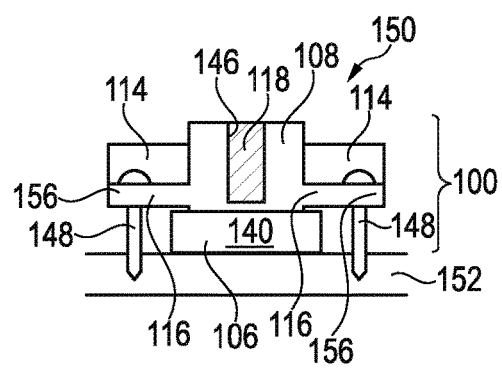
FIG. 17 illustrates a side view of the package of FIG. 16 mounted on a mounting base for obtaining an electronic device according to an exemplary embodiment.

FIG. 16 illustrates a top view of a package 100 according to an exemplary embodiment. FIG. 17 illustrates a side view of the package 100 of FIG. 16 mounted on a mounting base 152 for obtaining an electronic device 150 according to an exemplary embodiment.

The embodiment of FIG. 16 and FIG. 17 differs from the embodiment of FIG. 14 and FIG. 15 in particular in that, according to FIG. 16 and FIG. 17, the electronic device 150 comprises a cooling structure 114 embodied as a plurality of metallic cooling fins extending radially from a central main body of the connector 108. The blade-shaped cooling fins extending radially outwardly promote a proper heat removal from the connector 108 during operation of the package 100.

Figure 18:
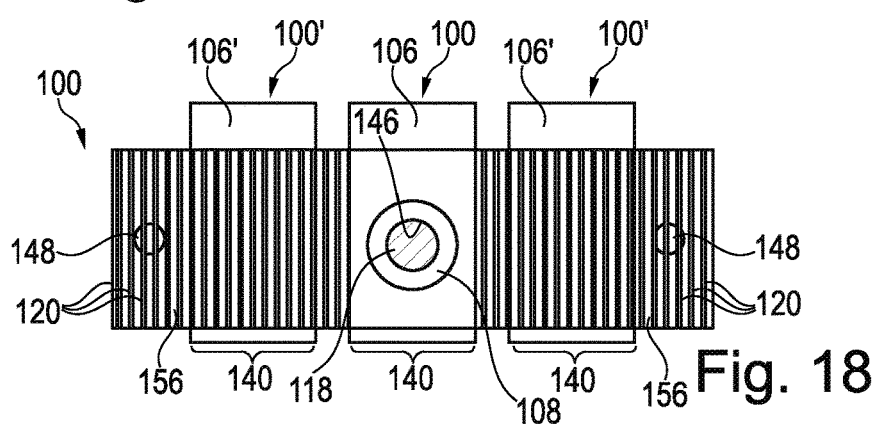
FIG. 18 illustrates a top view of packages according to an exemplary embodiment.
Figure 19:
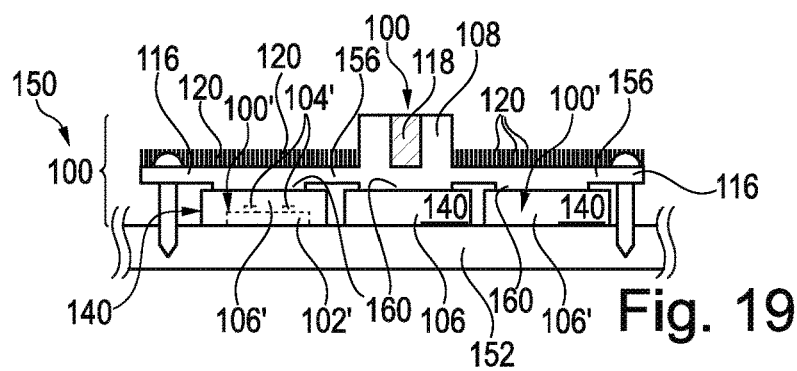
FIG. 19 illustrates a side view of the packages of FIG. 18 mounted on a mounting base for obtaining an electronic device according to an exemplary embodiment.

FIG. 18 illustrates a top view of a package 100 according to an exemplary embodiment. FIG. 19 illustrates a side view of the package 100 of FIG. 18 mounted on a mounting base 152 for obtaining an electronic device 150 according to an exemplary embodiment.

In the embodiment of FIG. 18 and FIG. 19, the illustrated electronic device 150 comprises two further packages 100' mounted on the same mounting base 152 as previously described package 100. Each of the further packages 100' comprises two further electronic components 104' mounted on a further carrier 102' and partially encapsulated by a further encapsulant 106'. This is illustrated in FIG. 19 only for one of the further packages 100'. As shown, the bulk connector 108 is electrically connected with and mounted on top of and above the electronic components 104, 104' of the package 100 and of the further packages 100'. As shown as well, the connector 108 comprises a cooling structure 120 configured for cooling all packages 100, 100' by an array of parallel cooling fins.

Hence, a single connector 108 may be shared among multiple packages 100, 100'. For this purpose, metallic legs 156 may be provided which extend from a central body of bulk connector 108. At a bottom side of each of the legs 156 as well as on a bottom side of said central body, a respective bump 160 is formed at which the bulk connector 108 is vertically connected with a respective package 100, 100' (or more precisely with a respective exposed portion of a respective clip 110 of a respective package 100, 100').

Figure 20:
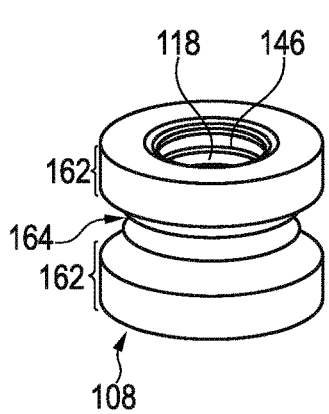
FIG. 20 and FIG. 21 illustrate bulk connectors of packages according to exemplary embodiments.
Figure 21:
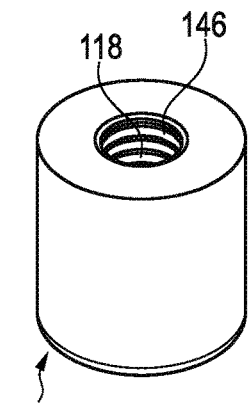

FIG. 20 and FIG. 21 illustrate connectors 108 for packages 100 according to exemplary embodiments.

The connector 108 of FIG. 20 comprises two opposing and substantially disc-shaped sections 162 with central recess 118 and internal thread 146. In an axial direction between the two disc-shaped sections 160, a radially confined central section 164 is arranged.

The connector 108 of FIG. 21 is a circular cylindrical body with recess 118 and internal thread 146.

Many other configurations of bulk connectors 108 are possible in other embodiments.

Figure 22:
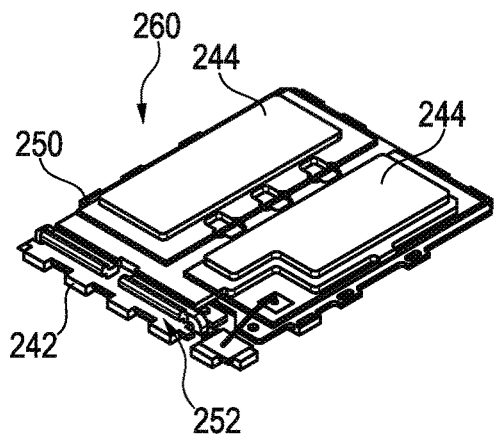
FIG. 22 illustrates a model of the conventional package used for a simulation.
Figure 23:
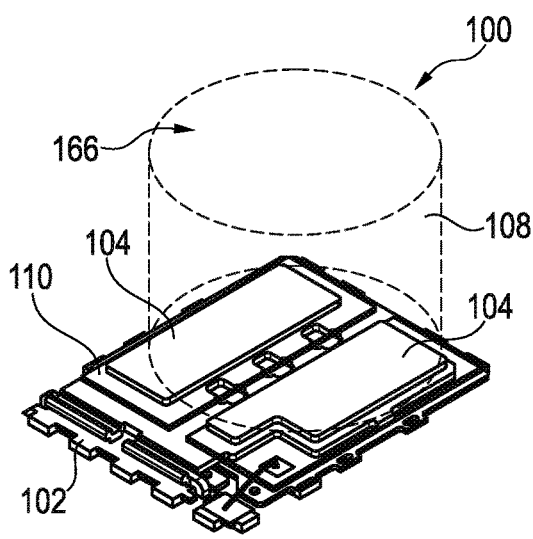
FIG. 23 illustrates a model of a package according to an exemplary embodiment used for a simulation.

FIG. 22 illustrates a model of a conventional package 260 used for a simulation. FIG. 23 illustrates a model of a package 100 according to an exemplary embodiment used for a simulation.

Conventional package 260 comprises a carrier 242 with two electronic components 244 mounted thereon. A clip 250 is arranged on top of the electronic components 244. An electric current (of 1A in the described simulation) may be applied at a position denoted with reference sign 252.

In contrast to this, package 100 according to exemplary embodiment may be constructed as described above. The electric current (of 1A in the described simulation) may be applied at a position denoted with reference sign 166.

Electrical simulations have been done to simulate the electrical package resistance of the conventional scalable half-bridge package 216 compared to a package 100 with mechanical top side connector 108 according to an exemplary embodiment.

In FIG. 22 and FIG. 23 both packages 260, 100 can be seen which are used as models for the simulation. In both cases, a DC current of 1 A has been simulated.

Figure 24:
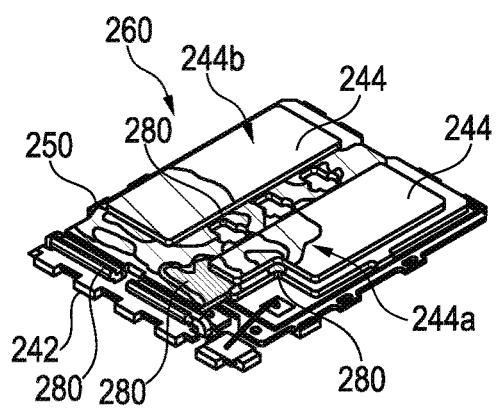
FIG. 24 illustrates a simulation result for a conventional package.
Figure 25:
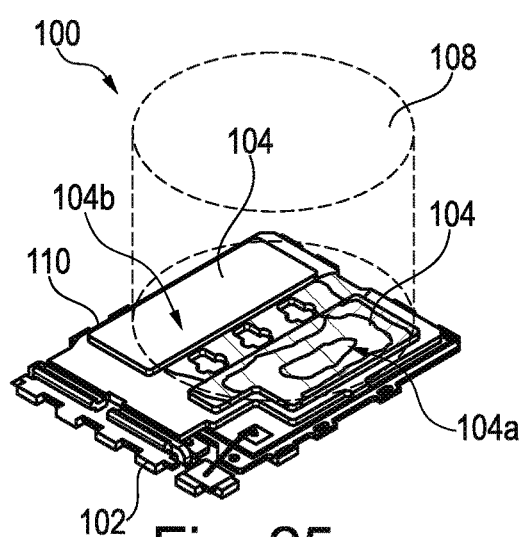
FIG. 25 illustrates a corresponding simulation result for a package according to an exemplary embodiment.

FIG. 24 illustrates a simulation result for conventional package 260, and FIG. 25 illustrates a corresponding simulation result for package 100 according to an exemplary embodiment. The simulated ohmic losses are shown in case that a first MOSFET-type electronic component 244a, 104a is active and a second MOSFET-type electronic component 244b, 104b is off. Conventional package 260 shows pronounced hot spots 280, which are advantageously absent in package 100.

Figure 26:
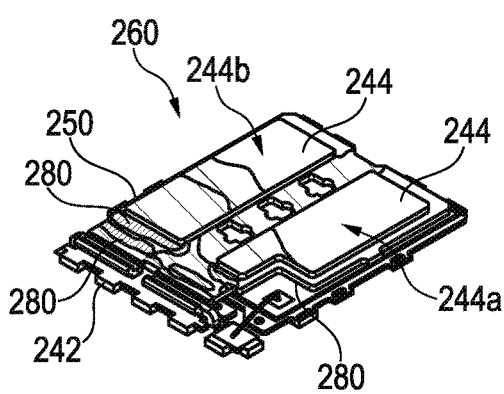
FIG. 26 illustrates a simulation result for a conventional package.
Figure 27:
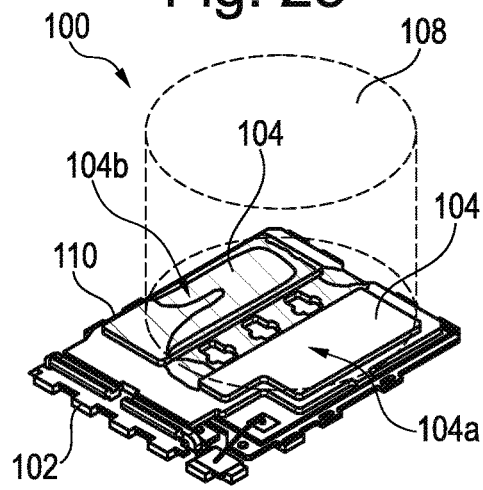
FIG. 27 illustrates a corresponding simulation result for a package according to an exemplary embodiment.

FIG. 26 illustrates a simulation result for the conventional package 260, and FIG. 27 illustrates a corresponding simulation result for package 100 according to an exemplary embodiment. The simulated ohmic losses are shown in case that the first MOSFET-type electronic component 244a, 104a is off and the second MOSFET-type electronic component 244b, 104b is active. Again, conventional package 260 shows pronounced hot spots 280, which are advantageously absent in package 100.

Figure 28:
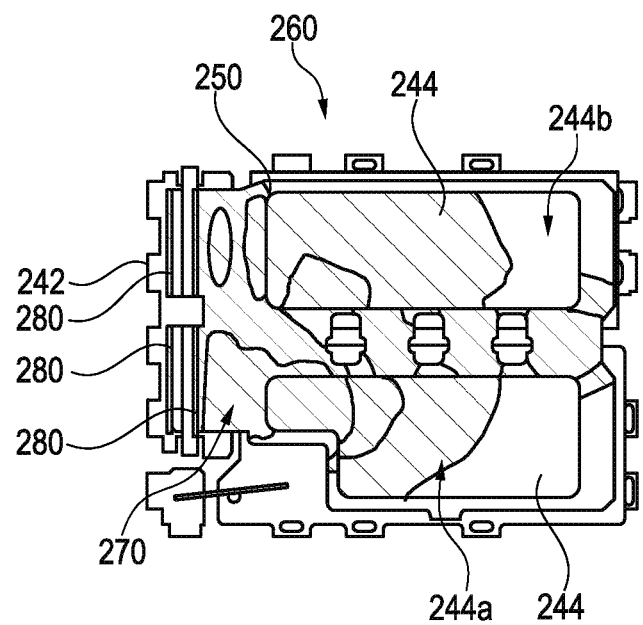
FIG. 28 illustrates a simulation result for a conventional package.
Figure 29:
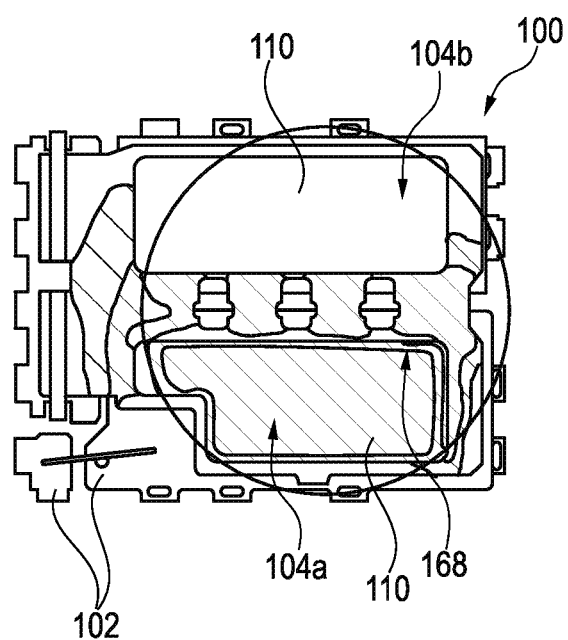
FIG. 29 illustrates a corresponding simulation result for a package according to an exemplary embodiment.

FIG. 28 illustrates a simulation result for conventional package 260, and FIG. 29 illustrates a corresponding simulation result for package 100 according to an exemplary embodiment.

FIG. 28 and FIG. 29 show the current distribution in both packages 260, 100 in case that the first MOSFET-type electronic component 244a, 104a is active. The peak current density (see reference signs 270 and 168) in the embodiments with the top side connector 108 is about a factor 10 lower compared to the conventional package 260. The peak current density 270 was $2.1 \cdot 10^6$ A/m², whereas the peak current density 168 was $2.1 \cdot 10^5$ A/m². Again, conventional package 260 shows pronounced hot spots 280, which are advantageously absent in package 100.

In Table 1, the simulated electrical resistance is shown for both packages 260, 100 and also for the different MOSFETs actived. The package resistance reduction is dramatic since the package 100 according to an exemplary embodiment has a vertical current flow.

Since for the package 100 according to an exemplary embodiment the clip 110 may be not required anymore to carry any power current down to the printed circuit board-type mounting base 152, the package 100 can be further improved by adapting the clip 110 which may allow to provide bigger chip-type electronic components 104 for the same package dimensions.

TABLE 1

Simulated DC package resistance

| DC resistance of the package (µΩ) | Conventional setup | Connector-on-top according to embodiment |
|---|---|---|
| Q1on-Q2off | 85 | 2 |
| Q1off-Q2on | 75 | 3 |

TABLE 2

Package resistance and power loss comparison for different PCB layout versions

| FIG. | Imax[A] | Package resistance | Conduction losses parasitic [W] | Conduction losses parasitic total [W] | Cooling path |
|---|---|---|---|---|---|
| 7A | 100 | 0.45 | 4.5 | 13.5 | Bottom |
| 7B | 100 | 0.08 | 0.8 | 2.4 | Bottom |
| 7C | 100 | 0.003 | 0.03 | 0.09 | Bottom and top |

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, wherein the package comprises:
    a carrier;
    electronic components mounted on the carrier;
    an encapsulant at least partially encapsulating the carrier and the electronic components;
    a clip connected to upper main surfaces of the electronic components; and
    an electrically conductive bulk connector which is electrically connected with and mounted above the electronic components and electrically connected to the clip;
    wherein the bulk connector comprises a plurality of cooling fins; and
    wherein the bulk connector has a height (H) which is larger than, in particular is at least three times or at least five times of, a height (h) of a package body composed of the carrier, the electronic components, the encapsulant and the clip.

2. The package according to claim 1, wherein the electronic components are semiconductor dies, in particular identical semiconductor dies.

3. The package according to claim 2, wherein each of the semiconductor dies comprises an integrated transistor, in particular a field effect transistor.

4. The package according to claim 1, wherein the electronic components are configured and connected to provide a half-bridge function.

5. The package according to claim 1, wherein the electrically conductive bulk connector is arranged outside of the encapsulant, in particular is arranged entirely outside of the encapsulant.

6. The package according to claim 1, wherein the bulk connector is mounted, in particular soldered, on an upper surface of the clip so that the electronic components are spaced with respect to the bulk connector by the clip.

7. The package according to claim 1, wherein the encapsulant only partially encapsulates the clip so that an exposed surface of the clip is in direct physical contact with the bulk connector.

8. The package according to claim 1, wherein the clip is connected to an upper main surface of the carrier.

9. The package according to claim 1, wherein the carrier comprises one of the group consisting of a leadframe, and a thermally conductive and electrically insulating sheet covered on both opposing main surfaces with an electrically conductive layer.

10. The package according to claim 1, wherein the bulk connector is a metal block, in particular a cylindrical metal block.

11. The package according to claim 1,
    wherein the bulk connector comprises a mounting provision configured for mounting the bulk connector on a mounting base, in particular a mounting provision configured for establishing a screwing connection with a mounting base.

12. An electronic device, wherein the electronic device comprises:
    a mounting base comprising a printed circuit board; and
    a package according to claim 1 mounted on the mounting base.

13. The electronic device according to claim 12, comprising at least one further package mounted on the mounting base, in particular comprising two further packages mounted on the mounting base, wherein each of the at least one further package comprises two further electronic components mounted on a further carrier and at least partially encapsulated by a further encapsulant, and wherein the bulk connector is electrically connected with and mounted above the electronic components of the package and of the at least one further package.

14. The electronic device according to claim 13, wherein the bulk connector comprises a cooling structure configured for cooling all packages, in particular comprising cooling fins, more particularly comprising an array of parallel cooling fins.

15. The electronic device according to claim 12, comprising at least one further package according to claim 1 mounted on the mounting base.

16. The electronic device according to claim 12, wherein the electronic components are located vertically between the mounting base and the bulk connector.

17. A package, wherein the package comprises:
a carrier;
electronic components mounted on the carrier;
an encapsulant at least partially encapsulating the carrier and the electronic components;
a clip connected to upper main surfaces of the electronic components; and
an electrically conductive bulk connector which is electrically connected with and mounted above the electronic components;
wherein the bulk connector comprises a plurality of cooling fins; and
wherein the bulk connector has a height (H) which is larger than, in particular is at least three times or at least five times of, a height (h) of a package body composed of the carrier, the electronic components, the encapsulant and the clip.

18. A package, wherein the package comprises:
a carrier;
electronic components mounted on the carrier;
an encapsulant at least partially encapsulating the carrier and the electronic components;
a clip connected to upper main surfaces of the electronic components; and
an electrically conductive bulk connector which is electrically connected with and mounted above the electronic components;
wherein the bulk connector comprises a plurality of cooling fins; and
wherein the bulk connector has a central recess with an internal thread.

19. A method of manufacturing a package, wherein the method comprises:
mounting electronic components on a carrier;
at least partially encapsulating the carrier and the electronic components by an encapsulant;
connecting a clip to upper main surfaces of the electronic components; and
mounting an electrically conductive bulk connector, which electrically connects the electronic components, above the electronic components;
wherein the bulk connector comprises a plurality of cooling fins; and
wherein the bulk connector has a height (H) which is larger than, in particular is at least three times or at least five times of, a height (h) of a package body composed of the carrier, the electronic components, the encapsulant and the clip.

20. A method of manufacturing a package, wherein the method comprises:
mounting electronic components on a carrier;
at least partially encapsulating the carrier and the electronic components by an encapsulant;
connecting a clip to upper main surfaces of the electronic components; and
mounting an electrically conductive bulk connector, which electrically connects the electronic components, above the electronic components;
wherein the bulk connector comprises a plurality of cooling fins; and
wherein the bulk connector has a central recess with an internal thread.

\* \* \* \* \*